(12) United States Patent
Yamaguchi et al.

(10) Patent No.: US 9,765,427 B2
(45) Date of Patent: Sep. 19, 2017

(54) VAPOR PHASE GROWTH APPARATUS

(71) Applicants: TAIYO NIPPON SANSO CORPORATION, Tokyo (JP); TNCSE Ltd., Kawasaki-shi (JP)

(72) Inventors: Akira Yamaguchi, Tokyo (JP); Kosuke Uchiyama, Tokyo (JP)

(73) Assignees: TAIYO NIPPON SANSO CORPORATION, Tokyo (JP); TNCSE Ltd., Kawasaki-shi (JP)

( * ) Notice: Subject to any disclaimer, the term of this patent is extended or adjusted under 35 U.S.C. 154(b) by 0 days.

(21) Appl. No.: 14/988,351

(22) Filed: Jan. 5, 2016

(65) Prior Publication Data
US 2016/0130695 A1 May 12, 2016

Related U.S. Application Data

(62) Division of application No. 13/379,077, filed as application No. PCT/JP2010/059906 on Jun. 11, 2010, now abandoned.

(30) Foreign Application Priority Data

Jun. 19, 2009 (JP) ................................. 2009-146740

(51) Int. Cl.
  *C23C 14/50* (2006.01)
  *C23C 16/458* (2006.01)
  *H01L 21/67* (2006.01)
  *H01L 21/687* (2006.01)

(52) U.S. Cl.
CPC ........ *C23C 14/505* (2013.01); *C23C 16/4584* (2013.01); *H01L 21/67109* (2013.01); *H01L 21/68764* (2013.01); *H01L 21/68771* (2013.01)

(58) Field of Classification Search
None
See application file for complete search history.

(56) References Cited

U.S. PATENT DOCUMENTS

| 6,068,441 | A | 5/2000 | Raaijmakers et al. |
| 7,449,071 | B2 | 11/2008 | Aggarwal et al. |
| 2002/0083899 | A1 | 7/2002 | Komeno et al. |

(Continued)

FOREIGN PATENT DOCUMENTS

| JP | 2004-525056 A | 8/2004 |
| JP | 2007-243060 A | 9/2007 |
| JP | 2007-266121 A | 10/2007 |

OTHER PUBLICATIONS

International Search Report dated Aug. 31, 2010, issued for PCT/JP2010/059906.

*Primary Examiner* — Joseph Miller, Jr.
(74) *Attorney, Agent, or Firm* — Locke Lord LLP (57) ABSTRACT

Disclosed is a rotation/revolution type vapor phase growth apparatus that allows for automatic meshing between an external gear and an internal gear. In the apparatus, on tooth side surfaces of at least one kind of a plurality of external gear members provided rotatably in a circumferential direction of an outer periphery of a disk-shaped susceptor and a ring-shaped fixed internal gear member having an internal gear to mesh with the external gear members, there is provided a guide slope that abuts against a tooth side surface of the other kind of the gear member(s) to guide both kinds of the gear members into a meshed state when both kinds of the gear members move from a non-meshed state to the meshed state.

4 Claims, 8 Drawing Sheets

(56) References Cited

U.S. PATENT DOCUMENTS

| | | |
|---|---|---|
| 2002/0106826 A1 | 8/2002 | Boguslavskiy et al. |
| 2003/0029384 A1 | 2/2003 | Nishikawa |
| 2006/0124062 A1 | 6/2006 | Nagai |

VAPOR PHASE GROWTH APPARATUS

TECHNICAL FIELD

The present invention relates to a vapor phase growth apparatus, and in particular, to a rotation/revolution type vapor phase apparatus that performs vapor-phase growth of a semiconductor thin film on a surface of a substrate while rotating/revolving the substrate.

BACKGROUND ART

As a vapor phase growth apparatus that allows for vapor phase growth on many substrates at a time, there is known a rotation/revolution type vapor phase growth apparatus in which a plurality of rotation susceptors are arranged in a circumferential direction of an outer periphery of a revolution susceptor, and an external gear is provided at outer peripheries of the rotation susceptors to mesh a fixed internal gear provided in a chamber with the external gear, thereby rotating/revolving the substrates during film deposition (for example, see Patent Literature 1).

PRIOR ART REFERENCE

Patent Literature

Patent Literature 1: JP-A-2007-243060

SUMMARY OF THE INVENTION

Problems to be Solved by the Invention

In a rotation/revolution type vapor phase growth apparatus as described above, detachment of the revolution susceptor for substrate replacement work or maintenance work causes the fixed internal gear and the external gear to be unmeshed. Thus, upon attachment of the revolution susceptor after the work, the fixed internal gear and the external gear need to be manually meshed with each other into a predetermined state. In the case of providing a large number of rotation susceptors, even only the confirmation of meshed state has taken a lot of trouble and time. Additionally, when the fixed internal gear and the external gear were in a non-meshed state, the revolution susceptor was brought into a largely inclined state, whereby large force acted on the gears, which had a possibility of causing a defect in the gears.

Therefore, it is an object of the present invention to provide a rotation/revolution type vapor phase growth apparatus that allows for automatic meshing between an external gear and an internal gear.

Means for Solving the Problems

As a first structure of the vapor phase growth apparatus of the present invention, in a vapor phase growth apparatus having a rotation/revolution mechanism including a disk-shaped susceptor provided rotatably in a chamber, a plurality of external gear members provided rotatably in a circumferential direction of an outer periphery of the susceptor, and a ring-shaped fixed internal gear member having an internal gear to mesh with the external gear members, at least one of the susceptor and the internal gear member is formed movably in a rotational axis line direction to a position of a meshed state where the external gear members and the internal gear member mesh with each other and to a position of a non-meshed state where both kinds of the gear members are apart from each other in the rotational axis line direction, and, on a tooth side surface of at least one kind of both kinds of the gear members, there is provided a guide slope that abuts against a tooth side surface of the other kind of both kinds thereof to guide both kinds of the gear members into the meshed state when both kinds of the gear members move from the position of the non-meshed state to the position of the meshed state.

As a second structure of the vapor phase growth apparatus of the present invention, in a vapor phase growth apparatus having a rotation/revolution mechanism including a disk-shaped susceptor provided rotatably in a chamber, a plurality of external gear members provided rotatably in a circumferential direction of an outer periphery of the susceptor, and a ring-shaped fixed internal gear member having an internal gear to mesh with the external gear members, a pair of upper and lower susceptor height adjusting members is opposingly provided between an upper surface of a shaft member supporting and rotating the susceptor and a lower surface of a center portion of the susceptor, and, on an opposing surface of each of the susceptor height adjusting members, there is formed, in a circumferential direction, a projection surface that projects toward the opposing susceptor height adjusting member, the susceptor height adjusting members being formed such that, when the projection surfaces are abutted against each other, the susceptor height adjusting members support the susceptor at a higher position than a position of the susceptor during film deposition to bring the external gear members and the internal gear member into a meshed state, and when ones of the projection surfaces having a small projection size are abutted against each other, the susceptor height adjusting members support the susceptor at the position during film deposition to bring the external gear members and the internal gear member into a predetermined meshed state.

As a third structure of the vapor phase growth of the present invention, in a vapor phase growth apparatus having a rotation/revolution mechanism including a disk-shaped susceptor provided rotatably in a chamber, a plurality of external gear members provided rotatably in a circumferential direction of an outer periphery of the susceptor, and a ring-shaped fixed internal gear member having an internal gear to mesh with the external gear members, at least one of the susceptor and the internal gear member is formed movably in a rotational axis line direction to a position of a meshed state where the external gear members and the internal gear member mesh with each other and to a position of a non-meshed state where both kinds of the gear members are apart from each other in the rotational axis line direction; on a tooth side surface of at least one kind of both kinds of the gear members, there is provided a guide slope that abuts against the tooth side surface of the other kind of the gear member(s) to guide both kinds of the gear members into the meshed state when both kinds of the gear members move from the position of the non-meshed state to the position of the meshed state; between an upper surface of a shaft member supporting and rotating the susceptor and a lower surface of a center portion of the susceptor, there is opposingly provided a pair of upper and lower susceptor height adjusting members, each of which has projection surfaces having different projection sizes formed on each opposing surface thereof in a circumferential direction, the susceptor height adjusting members being formed such that, when ones of the projection surfaces having a large projection size are abutted against each other, the susceptor height adjusting members support the susceptor at a higher position than a position of the susceptor during film deposition to bring the external gear members and the internal gear member into the meshed state on the guide slope, and when the ones of the projection surfaces having the large projection size are abutted with ones of the projection surfaces having a small projection size, the susceptor height adjusting members support the susceptor at the position during film deposition to bring the external gear members and the internal gear member into a predetermined meshed state.

Advantages of the Invention

According to the first structure of the vapor phase growth apparatus of the present invention, upon the attachment of the susceptor, when the external gear members and the internal gear member move from the non-meshed state to the meshed state, the guide slope can guide both kinds of the gear members into the meshed state. Usually, both kinds of the gear members are surely guided into the meshed state only by slightly turning in either direction the external gear members provided in a freely rotatable state with respect to the susceptor. Therefore, it is also possible to automate the detachment of the susceptor by eliminating manual meshing work.

According to the second structure of the vapor phase growth apparatus of the present invention, upon the attachment of the susceptor, the susceptor is supported at a higher position than the position of the susceptor during film deposition by means of the susceptor height adjusting members. Thereby, the external gear members do not largely incline even when the external gear members and the internal gear member are brought into the non-meshed state. Thus, no defect occurs in the gears. The shaft member rotates the susceptor in the state of being supported at a higher position than during film deposition, whereby the external gear members and the internal gear member are brought from the non-meshed state into the meshed state. Accordingly, by supporting the susceptor at the position during film deposition by the susceptor height adjusting members, the external gear members and the internal gear member can be brought into a predetermined meshed state and also the position of the susceptor in the chamber can be set to a predetermined height.

According to the third structure of the vapor phase growth apparatus of the present invention, occurrence of a defect in the gears can be more surely prevented, as well as a transition from the non-meshed state to the meshed state in the external gear members and the internal gear member can be more surely achieved.

MODES FOR CARRYING OUT THE INVENTION

A vapor phase growth apparatus shown in FIGS. 1 to 8 shows a first embodiment example of the present invention. The vapor phase growth apparatus includes a disk-shaped susceptor 12 provided rotatably in a chamber 11, a ring-shaped bearing member 13 provided in each of a plurality of a circular openings 12a formed in a circumferential direction of an outer periphery of the susceptor 12, an external gear member (a rotation susceptor) 14 each mounted rotatably via a plurality of rolling members (balls) 13a on each bearing member 13, a ring-shaped fixed internal gear member 15 to mesh with the external gear member 14, a heating unit (heater) 17 for heating a substrate 16 retained on a surface of the external gear member 14 from a back surface side of the susceptor 12, and a flow channel 18 for guiding a raw material gas in a direction parallel to the surface of the substrate 16.

Figure 1:
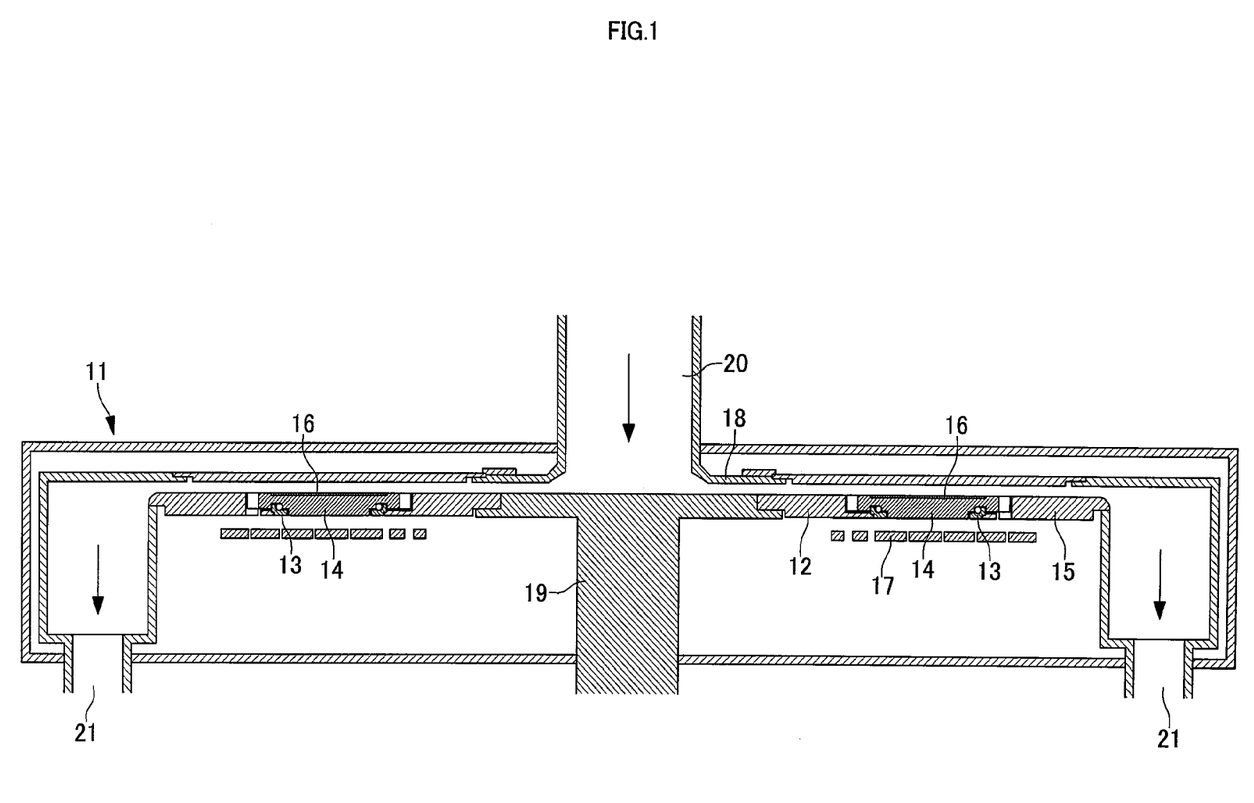
FIG. 1 is a cross-sectional front view showing a first embodiment example of a vapor phase growth apparatus according to the present invention.

At a lower portion of a center of the susceptor 12 is provided a shaft member 19 for rotating the susceptor 12, and at an upper portion of a center of the flow channel 18 is provided a gas introducing portion 20 for introducing the raw material gas into the flow channel 18. On an outer periphery of the flow channel 18 is provided a plurality of gas discharging portions 21.

In a state in which the bearing member 13 and the external gear member 14 are assembled together and the substrate 16 is retained on the external gear member 14, a lower surface of the bearing member 13 and a lower surface of the external gear member 14 are formed to be flush with a lower surface of the susceptor 12, and an outer peripheral upper surface of the external gear member 14 and an upper surface of the substrate 16 are formed to be flush with an upper surface of the susceptor 12.

Figure 2:
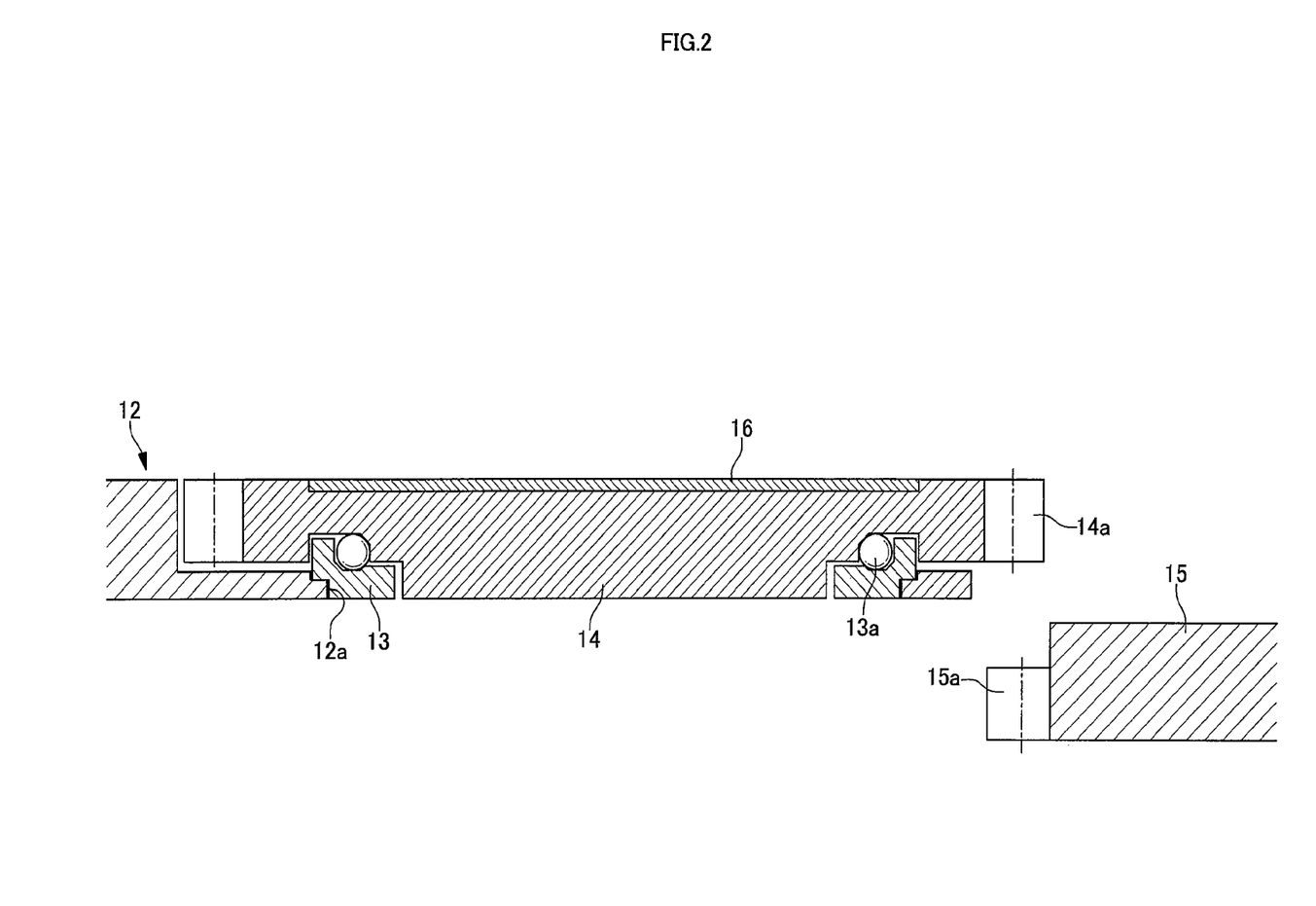
FIG. 2 is a cross-sectional front view of a main part showing a situation in which a susceptor and an external gear member have been moved relatively with respect to each other in a rotational axis line direction.

Either one or both of the susceptor 12 and the fixed internal gear member 15 are provided movably in a rotational axis line direction (an up-and-down direction). Upon substrate replacement work, maintenance work, or the like, as shown in FIG. 2, the bearing member 13 and the external gear member 14, together with the susceptor 12, are moved to a position apart above the fixed internal gear member 15, and an external gear 14*a* of the external gear member 14 and an internal gear 15*a* of the fixed internal gear member 15 are moved from a meshed state position shown in FIG. 1 to a non-meshed state position shown in FIG. 2.

Upon assembly of the susceptor 12 to the fixed internal gear member 15 after completion of the substrate replacement work, maintenance work, or the like, to bring the external gear 14*a* of the external gear member 14 and the internal gear 15*a* of the fixed internal member 15 in the non-meshed state into the meshed state, on a tooth side surface of at least one of the gear members of the external gear 14*a* and the internal gear 15*a* is provided a guide slope that abuts against a tooth side surface of the other gear member to guide both gear members into the meshed state.

Figure 3:
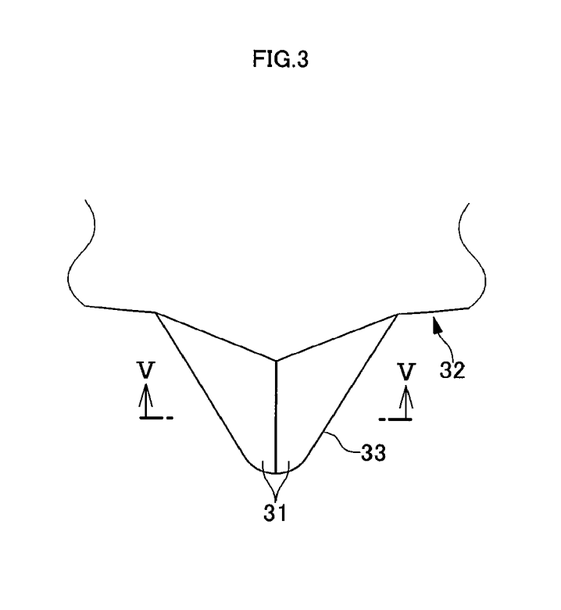
FIG. 3 is a plan view showing one shape example as a guide slope provided on a tooth side surface of a gear member.
Figure 4:
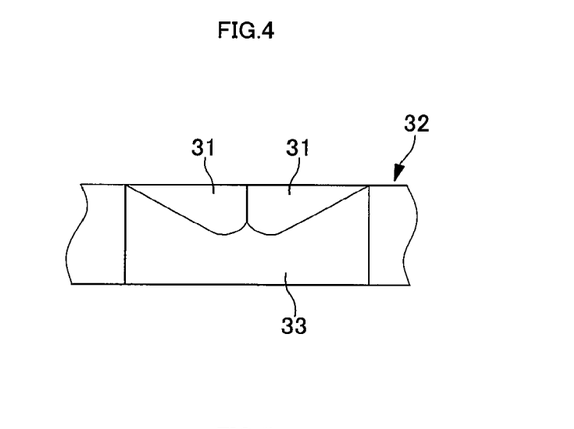
FIG. 4 is a front view showing a portion of a tooth of the same gear member.
Figure 5:
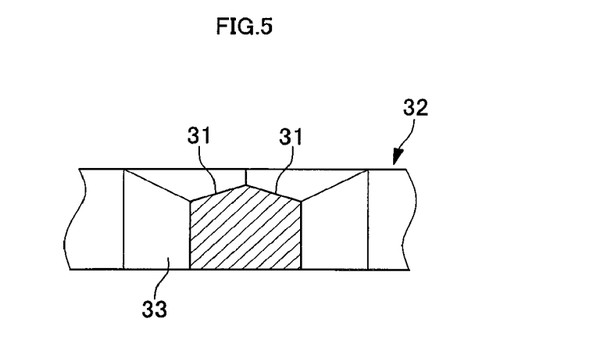
FIG. 5 is a cross-sectional view taken along line V-V of FIG. 3.

Guide slopes 31 shown in FIG. 3 to FIG. 5 are obtained by forming one side surface of a tooth 33 of a gear member 32 into a mountainous shape having inclined planes. By providing such guide slopes 31 respectively on opposing side surfaces of the external gear 14*a* of the external gear member 14 and the internal gear 15*a* of the fixed internal gear member 15, the guide slopes 31 provided on the tooth side surfaces of both gears are brought into a state of being abutted against each other if tooth positions of both gear members are displaced when moving from the non-meshed state position shown in FIG. 2 to the meshed state position shown in FIG. 1. In this case, the fixed internal gear member 15 is fixed to the chamber 11 and the external gear member 14 is provided in a freely rotatable state on the susceptor 12 by the bearing member 13. Thus, the external gear 14*a* of the external gear member 14 is guided by the guide slopes 31, whereby the external gear member 14 is slightly turned, resulting that teeth of the external gear 14*a* enter between teeth of the internal gear 15*a* to bring the external gear 14*a* and the internal gear 15*a* into a predetermined meshed state.

Figure 6:
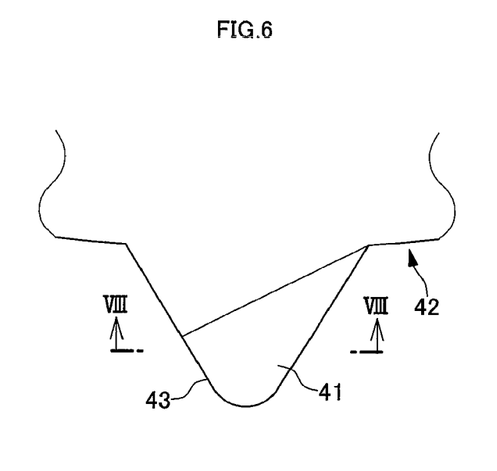
FIG. 6 is a plan view showing another shape example as a guide slope provided on a tooth side surface of a gear member.
Figure 7:
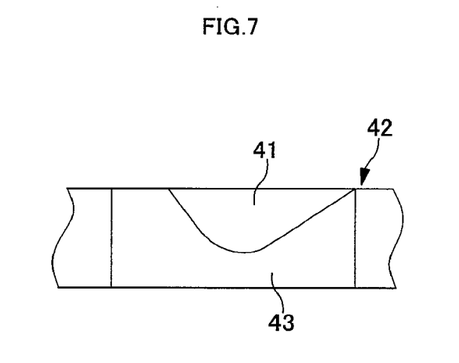
FIG. 7 is a front view showing a portion of a tooth of the same gear member.
Figure 8:
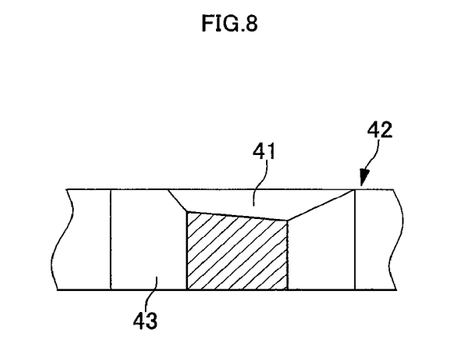
FIG. 8 is a cross-sectional view taken along line VIII-VIII of FIG. 6.

In addition, a guide slope 41 shown in FIG. 6 to FIG. 8 is obtained by forming an entire part of one side surface of a tooth 43 of a gear member 42 into an inclined plane. On the external gear 14*a* and the internal gear 15*a* opposing each other is provided respectively the guide slope 41 for inclining in the same direction upon abutment of both gears. Thereby, when the guide slopes 41 are abutted against each other, the external gear member 14 is slightly turned such that the external gear 14*a* moves along inclinations of both guide slopes 41 and the teeth of the external gear 14*a* enter between the teeth of the internal gear 15*a* to bring both gears 14*a* and 15*a* into a predetermined meshed state.

As described above, by providing the guide slopes 31 or the guide slope 41 for guiding the teeth of the gears in the non-meshed state into the meshed state, upon assembly of the susceptor 12 fitted with the bearing member 13 and the external gear member 14 to the fixed internal gear member 15, the guide slope(s) can automatically and surely bring the teeth of the external gear 14*a* and the teeth of the internal gear 15*a* into a predetermined meshed state even if the teeth of the external gear 14*a* and the teeth of the internal gear 15*a* are displaced toward each other and brought into the non-meshed state. Additionally, by assembling the fixed internal gear member 15 to the susceptor 12 that is being rotated at an appropriate speed, both gears 14*a* and 15*a* can more smoothly mesh with each other. In terms of rotation of the susceptor 12, for example, the susceptor 12 may be rotated approximately two to three times at a slower rotation speed than a rotation speed during film deposition or may be rotated only in one direction.

The shapes and combinations of respective constituent members can be appropriately determined according to the dimensions of the vapor phase growth apparatus, the number of substrates processed one time, the dimensions of the substrate, the kind of the raw material gas, and the like. An open and close mechanism of the chamber and a carrying mechanism of the susceptor are arbitrary. In addition, depending on conditions of the gears, the guide slope(s) may be provided only on the tooth side surface of either one of the gears, or the guide slope(s) may be curved surface(s).

A vapor phase growth apparatus shown in FIG. 9 to FIG. 14 shows a second embodiment example of the present invention. In the description hereinbelow, the same reference numerals will be given to the same constituent elements as those of the vapor phase growth apparatus shown in the first embodiment example above and detailed explanation thereof will be omitted.

Figure 9:
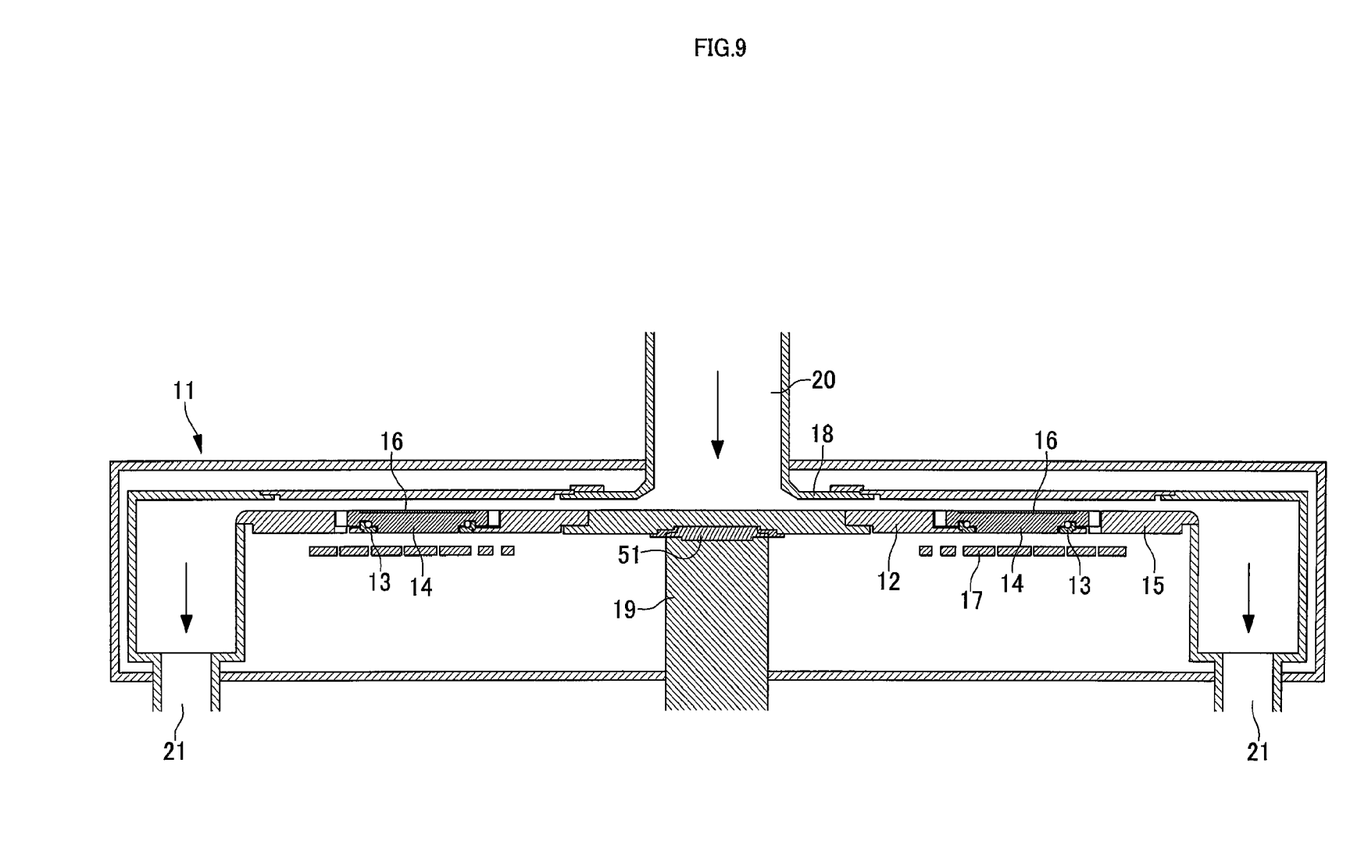
FIG. 9 is a cross-sectional front view showing a second embodiment example of the vapor phase growth apparatus according to the present invention.

The vapor phase growth apparatus shown in the present embodiment example has basically the same structure as that of the vapor phase growth apparatus shown in the above first embodiment example. The disk-shaped susceptor 12 provided rotatably in the chamber 11 is supported by the shaft member 19 via a pair of upper and lower susceptor height adjusting members 51 and 61 made of quartz, which are provided respectively on an upper surface of the shaft member 19 and the lower surface of the center portion of the susceptor 12.

Figure 10:
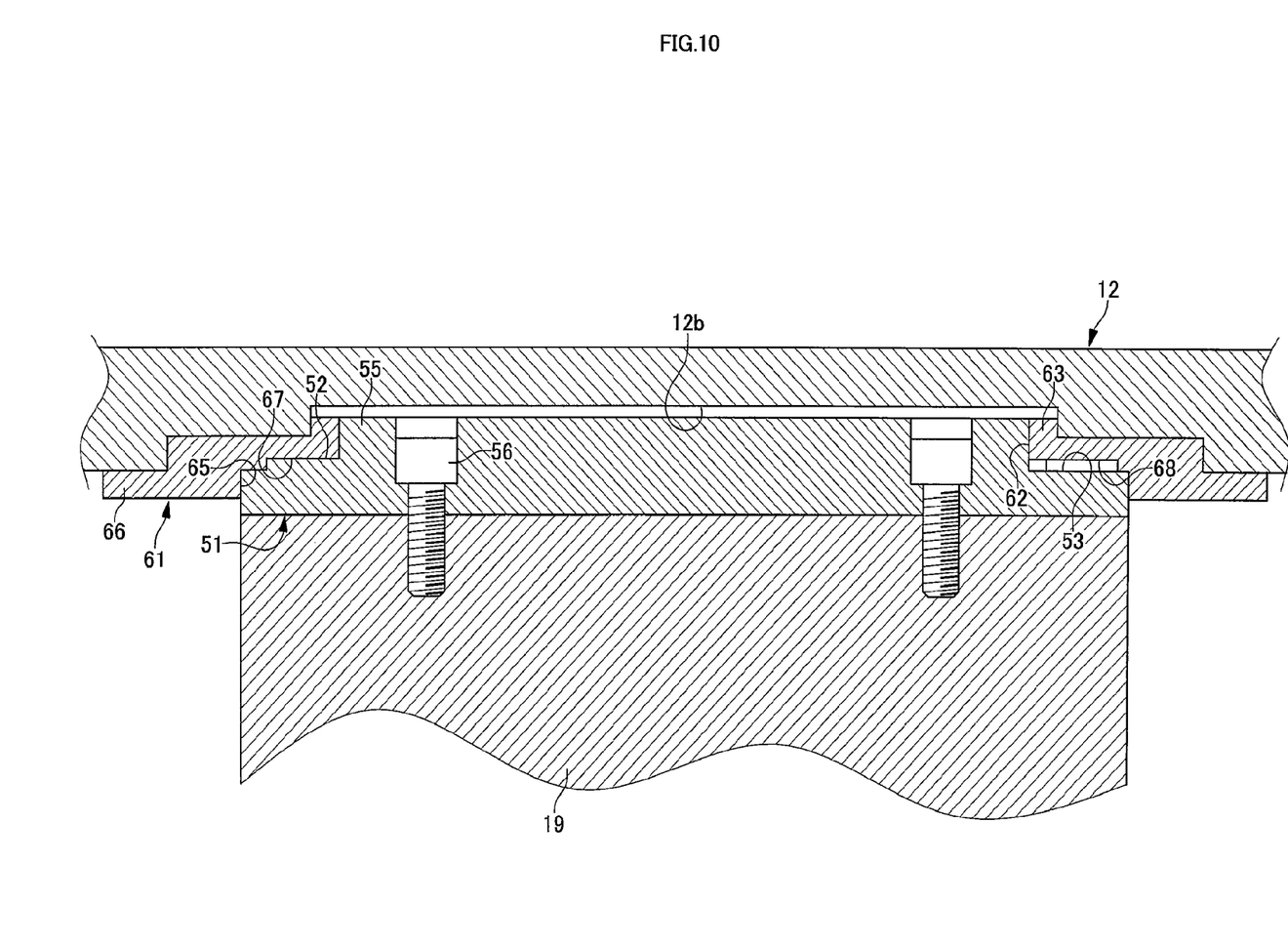
FIG. 10 is a cross-sectional front view showing a susceptor height adjusting member.
Figure 11:
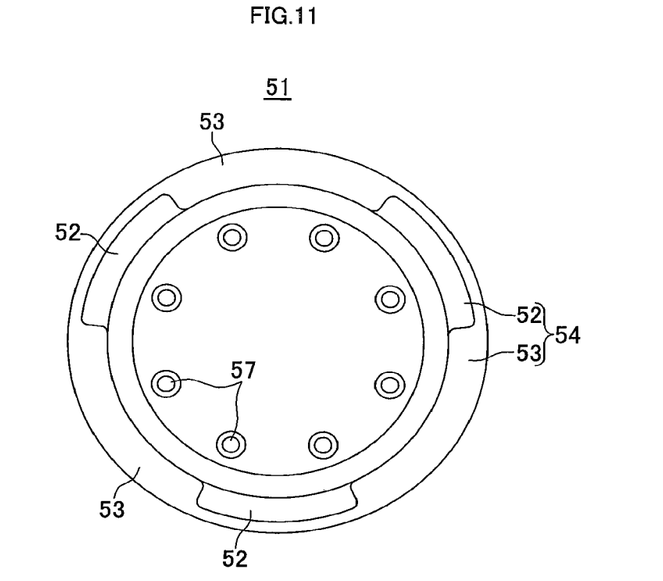
FIG. 11 is a plan view of the susceptor height adjusting member provided on an upper surface of a shaft member.

In the lower susceptor height adjusting member 51 provided on the upper surface of the shaft member 19, stepped concave and convex portions 54 are formed at an interval of 120 degrees, in which, in a circumferential direction of an upper-surface outer periphery of the member 51, three projection portions 52 upwardly projecting toward the opposing upper susceptor height adjusting member 61 and three concave portions 53 formed between the respective projection portions 52 are each alternately formed to be grouped into three sets. Additionally, on an inner peripheral side of the stepped concave and convex portion 54 is formed a ring-shaped projection portion 55 upwardly projecting toward the upper susceptor height adjusting member 61, and on an inner peripheral side of the ring-shaped projection portion 55 are formed screw holes 57 through which eight screws 56 are inserted to mount the lower susceptor height adjusting member 51 to the upper surface of the shaft member 19. The screw holes 57 are formed at an equal interval at eight points in the circumferential direction. The lower susceptor height adjusting member 51 is made of quartz and the shaft member 19 is made of carbon. Thus, to bond the members made of the different materials, both members are mechanically bonded together.

Figure 12:
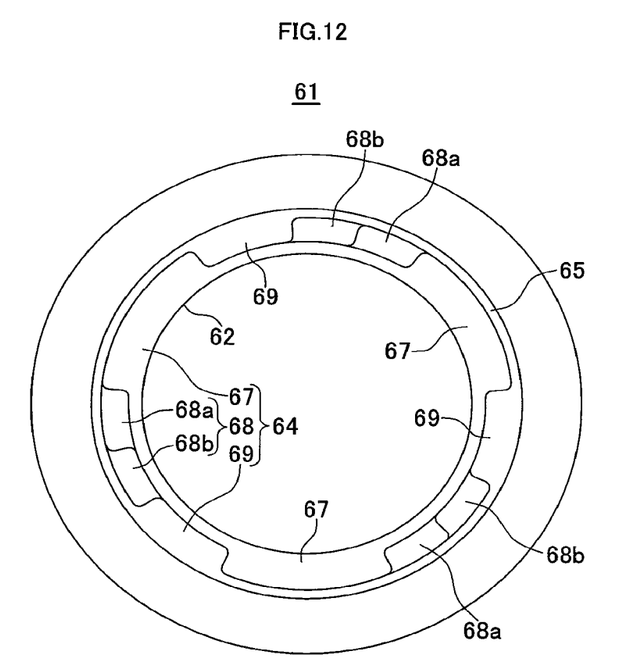
FIG. 12 is a bottom surface view of a susceptor height adjusting member provided on a lower surface of a center portion of a susceptor.

Meanwhile, in the upper susceptor height adjusting member 61 provided on the lower surface of the center portion of the susceptor 12, a circular opening 62 having an inner diameter corresponding to an outer diameter of the ring-shaped projection portion 55 is formed at the center portion, and, on an outer peripheral upper surface of the circular opening 62, is provided projectingly upwardly a ring-shaped fitting projection portion 63 having an outer diameter corresponding to an inner diameter of a fitting concave portion 12*b* formed on the lower surface of the center portion of the susceptor 12. On a backside of the ring-shaped fitting projection portion 63, is formed a stepped concave and convex portion 64 corresponding to the projection portion 52 and the concave portion 53 of the lower susceptor height adjusting member 51. In addition, on an outer periphery of the stepped concave and convex portion 64, is provided projectingly downwardly a ring-shaped projection portion 65 having an inner diameter corresponding to an outer diameter of the lower susceptor height adjusting member 51.

On an outer periphery of the ring-shaped projection portion 65, is provided a flange 66 for mounting the upper susceptor height adjusting portion 61 to the lower surface of the center portion of the susceptor 12. The upper susceptor height adjusting portion 61 is made of quartz and the susceptor 12 is made of SiC-coated carbon. Thus, to bond together the members made of the different materials, the upper susceptor height adjusting member 61 is provided with the flange 66, and for example, the members are mechanically bonded together by a screw hole and a screw that are not shown in the drawing.

The stepped concave and convex portion 64 of the upper susceptor height adjusting member 61 includes a concave portion 67 formed at a predetermined interval in a circumferential direction, a stepped projection portion 68 having a first projection portion 68a and a second projection portion 68b projecting in a two-stepped shape downwardly toward the lower susceptor height adjusting member 51, and a rotation stopper convex portion 69 projecting more downwardly than the projection portion 68, and three sets of the portions 67, 68, and 69 are provided at an interval of 120 degrees in the circumferential direction of the member 61.

The concave portion 67 of the upper susceptor height adjusting member 61 has a size capable of housing the projection portion 52 of the lower susceptor height adjusting member 51, and the concave portion 53 of the lower susceptor height adjusting member 51 has a size capable of housing the projection portion 68 and the whirl-stop convex portion 69 of the upper susceptor height adjusting member 61.

Projection heights of the first projection portion 68a and the second projection portion 68b of the projection portion 68 are appropriately determined according to the thicknesses of the external gear member 14 and the fixed internal gear member 15 and the presence or absence of the guide slope(s). Additionally, regarding the respective projection portions 52, 68a, and 68b and the whirl-stop convex portion 69, when the shaft member 19 is rotated in a forward direction (a rotation direction during film deposition) in a state in which the susceptor 12 is mounted on the upper surface of the shaft member 19 via the susceptor height adjusting members 51 and 61, rising portions (stepped portions) of the respective projection portions 52, 68a, and 68b and the whirl-stop convex portion 69 are abutted against each other to serve to transmit the rotation of the shaft member 19 to the susceptor 12.

Figure 13:
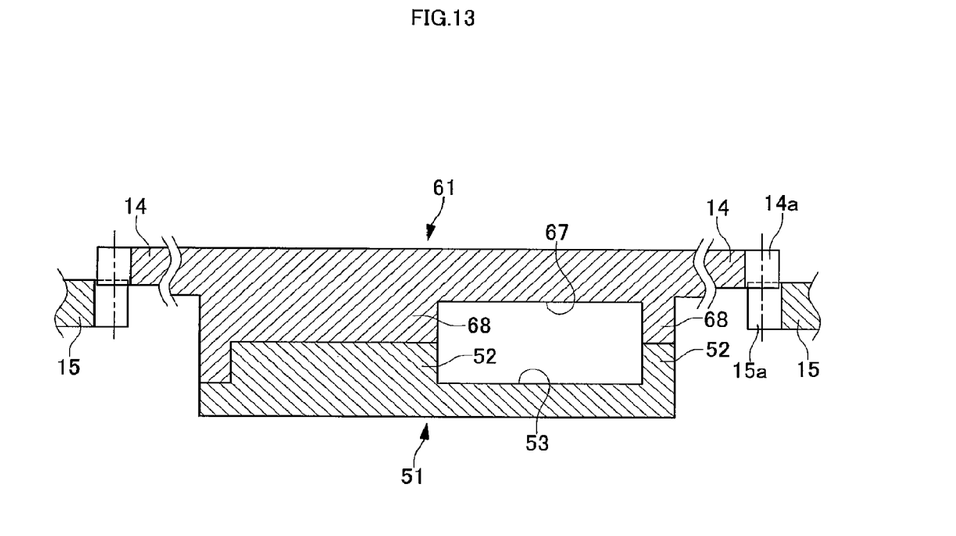
FIG. 13 is an illustrative view showing a situation in which the susceptor is supported by the susceptor height adjusting members at a higher position than a position of the susceptor during film deposition.

Upon setting of the susceptor 12 on the shaft member 19 after detaching the susceptor 12 and finishing substrate replacement work, maintenance work or the like, as shown in FIG. 13, a leading end face of the projection portion 52 of the lower susceptor height adjusting member 51 and a leading end face of the projection portion 68 of the upper susceptor height adjusting member 61, that is, in the present embodiment example, a leading end face of either one of the first projection portion 68a and the second projection portion 68b are brought into a state of being abutted against each other. In this way, by abutting the leading end faces of both projection portions 52 and 68 against each other, the susceptor 12 is brought into a state of being supported with respect to the shaft member 19 at a higher position than a height of the susceptor 12 during film deposition.

In this manner, by supporting the susceptor 12 at a higher position than the height thereof during film deposition, the external gear member (rotation susceptor) 14 positioned on the outer periphery of the susceptor 12 is situated at a higher position than the fixed internal gear member 15, whereby a lower portion of the external gear member 14 and an upper portion of the fixed internal gear member 15 can be brought into a state of slightly meshing with each other, for example into a 1 to 2 mm-meshed state. Accordingly, even when the external gear member 14 and the internal gear member 15 are in the non-meshed state and the external gear 14a of the external gear member 14 is in a state of being driven onto the internal gear 15a of the internal gear member 15, the external gear member 14 does not largely incline, so that no defect occurs in the gears.

Furthermore, even when the external gear member 14 and the internal gear member 15 are in the non-meshed state, by forwardly rotating the shaft member 19 in the state of supporting the susceptor 12 at a higher position than the position during film deposition, the rising portions of both projection portions 52 and 68 can be abutted against each other to thereby transmit the rotation of the shaft member 19 to the susceptor 12, as described above. Then, along with the rotation of the susceptor 12, the external gear member 14 moves along an inner peripheral side of the fixed internal gear member 15. Thereby, when the external gear member 14 reaches a position where the external gear 14a and the internal gear 15a mesh with each other, the external gear 14a that was in the state of being driven onto the internal gear 15a meshes with the internal gear 15a to be brought into the state shown in FIG. 13.

Accordingly, by rotating the susceptor 12 after setting the susceptor 12 on the shaft member 19, for example, by rotating it approximately one time at a slower rotation speed than a rotation speed during film deposition, the teeth of the external gear 14a that was in the state of being driven onto the internal gear 15a fall between the teeth of the internal gear 15a, so that the external gear member 14 and the internal gear member 15 can mesh with each other.

Figure 14:
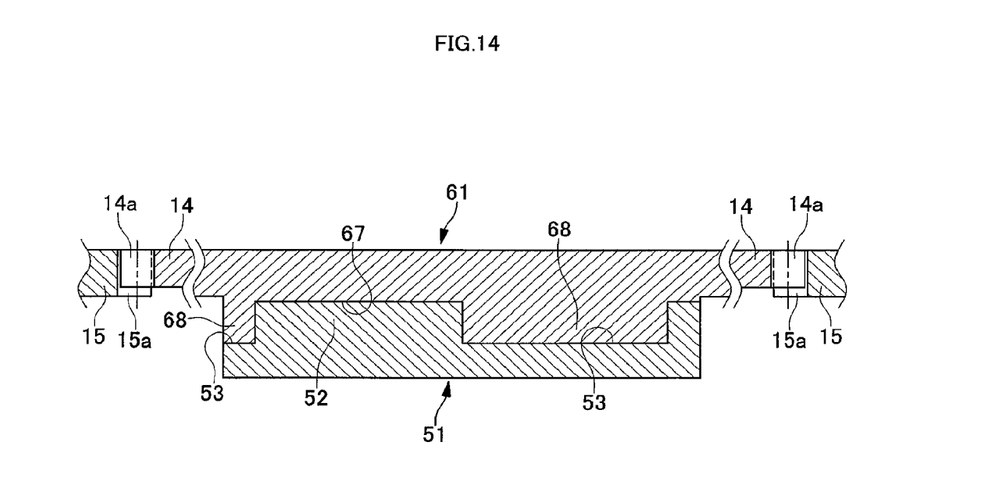
FIG. 14 is an illustrative view showing a situation in which the susceptor is supported by the susceptor height adjusting members in the position thereof during film deposition.

When the shaft member 19 is rotated in a reverse direction after the external gear member 14 and the internal gear member 15 are brought into the meshed state, the shaft member 19 rotates in the reverse direction in a state in which the susceptor 12 hardly rotates, since the susceptor height adjusting members 51 and 61 are not provided with any projection portion serving as a whirl stop to the reverse direction and any whirl-stop convex portion. Thus, as shown in FIG. 14, the projection portion 52 of the lower susceptor height adjusting member 51 is housed into the concave portion 67 of the upper susceptor height adjusting member 61, as well as the projection portion 68 and the whirl-stop convex portion 69 of the upper susceptor height adjusting member 61 are housed into the concave portion 53 of the lower susceptor height adjusting member 51.

In this manner, by housing the respective projection portions 68 and 52 in the respective concave portions 53 and 67, the susceptor 12 is brought into the state of being supported at a position corresponding to the height thereof during film deposition. Thereby, since the external gear member 14 descends with respect to the fixed internal gear member 15, the external gear member 14 and the fixed internal gear member 15 are brought into a predetermined meshed state for film deposition.

In addition, when the guide slopes shown in the above first embodiment example are provided, by setting the height of the susceptor 12 such that the external gear member 14 meshes with the fixed internal gear member 15 on a portion of the guide slopes upon supporting of the susceptor 12 at a higher position than during film deposition, the meshing between the external gear member 14 and the fixed internal gear member 15 can be further ensured.

Additionally, the projection portion to be provided may be an only one-stepped portion, or the whirl-stop convex portion may be provided on either one of the upper and lower susceptor height adjusting members.

DESCRIPTION OF REFERENCE NUMERALS

11 . . . Chamber
12 . . . Susceptor
12a . . . Circular opening
12b . . . Fitting concave portion
13 . . . Bearing member
13a . . . Rolling member
14 . . . External gear member
14a . . . External gear
15 . . . Fixed internal gear member
15a . . . Internal gear
16 . . . Substrate
17 . . . Heating unit
18 . . . Flow channel
19 . . . Shaft member
20 . . . Gas introducing portion
21 . . . Gas discharging portion
31, 41 . . . Guide slope
32, 42 . . . Gear member
33, 43 . . . Tooth
51 . . . Lower susceptor height adjusting member
52 . . . Projection portion
53 . . . Concave portion
54 . . . Stepped concave and convex portion
55 . . . Ring-shaped projection portion
56 . . . Screw
57 . . . Screw hole
61 . . . Upper susceptor height adjusting member
62 . . . Circular opening portion
63 . . . Fitting projection portion
64 . . . Stepped concave and convex portion
65 . . . Ring-shaped projection portion
66 . . . Flange
67 . . . Concave portion
68 . . . Projection portion
68a . . . First projection portion
68b . . . Second projection portion
69 . . . Whirl-stop convex portion

The invention claimed is:

1. A vapor phase growth method comprising the following steps:
providing a vapor phase growth apparatus having a rotation/revolution mechanism of a substrate comprising:
a disk-shaped susceptor provided in a chamber,
an external gear members provided in a circumferential direction of an outer periphery of the susceptor,
a ring-shaped fixed internal gear member having an internal gear to mesh with an external gear member,
a shaft member supporting and rotating the susceptor, and
a pair of upper and lower susceptor height adjusting members formed between an upper surface of the shaft member and a lower surface of a center portion of the susceptor and facing each other,
the pair of upper and lower susceptor height adjusting members each comprising:
projection portions projecting from a surface facing the opposing susceptor height adjusting member toward the opposing susceptor height adjusting member; and
concave portions formed between the projection portions in a circumferential direction of each susceptor height adjusting member, the projection portions and the concave portions are each alternately formed to be grouped into a plurality of sets in the circumferential direction,
when leading end faces of the projection portions of the pair of the susceptor height adjusting members are abutted against each other, supporting the susceptor by the susceptor height adjusting members at a higher position than a position of the susceptor during film deposition to bring the external gear members and the internal gear member into a 1 to 2 mm-meshed state, and
when the projection portions of the pair of the susceptor height adjusting members are positioned inside the concave portions, supporting the susceptor by the susceptor height adjusting members at the position thereof during film deposition to bring the external gear members and the internal gear member into a predetermined meshed state; and
performing the vapor phase growth of a semiconductor thin film on a surface of the substrate while rotating or revolving the substrate.

2. The method according to claim 1, wherein
at least one of the susceptor and the internal gear member is formed in a rotational axis line direction to a position of a meshed state where the external gear members and the internal gear member mesh with each other and to a position of a non-meshed state where both kinds of the gear members are apart from each other in the rotational axis line direction;
on a tooth side surface of at least one kind of both kinds of the gear members, there is provided a guide slope that abuts against a tooth side surface of the other kind of both kinds thereof to guide both kinds of the gear members into the meshed state when both kinds of the gear members move from the position of the non-meshed state to the position of the meshed state; and
when leading end faces of the projection portions of the pair of the susceptor height adjusting members are abutted against each other, the susceptor height adjusting members support the susceptor at a higher position than a position of the susceptor during film deposition to bring the external gear members and the internal gear member into the meshed state on the guide slope.

3. A vapor phase growth method comprising the following steps:
supporting a susceptor by a pair of susceptor height adjusting members at a higher position than a position of the susceptor located during film deposition to bring an external gear member and an internal gear member into a 1 to 2 mm-meshed state, when leading end faces of projection portions of the pair of the susceptor height adjusting members are abutted against each other, and
supporting the susceptor by the pair of susceptor height adjusting members at the position thereof during film deposition to bring the external gear member and the internal gear member into a predetermined meshed state, when the projection portions of the pair of the susceptor height adjusting members are positioned inside concave portions formed between the projection portions in a circumferential direction of each susceptor height adjusting member.

4. A vapor phase growth method comprising the following steps:
holding a susceptor at a first height making an external gear member and an internal gear member into a 1 to 2 mm-meshed state;

then rotating the susceptor making the external gear member and the internal gear member into a meshed state;
then holding the susceptor at a second height which is lower than the first height; and
then conducting a film deposition.

\* \* \* \* \*